(12) United States Patent
Tanabe et al.

(10) Patent No.: US 7,885,307 B2
(45) Date of Patent: Feb. 8, 2011

(54) VERTICAL-CAVITY SURFACE-EMITTING SEMICONDUCTOR LASER DEVICE

(75) Inventors: Kinuka Tanabe, Tokyo (JP); Yoshihiko Ikenaga, Tokyo (JP); Norihiro Iwai, Tokyo (JP); Takeo Kageyama, Tokyo (JP); Koji Hiraiwa, Tokyo (JP); Hirokazu Yoshikawa, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 743 days.

(21) Appl. No.: 11/551,101

(22) Filed: Oct. 19, 2006

(65) Prior Publication Data

US 2007/0091965 A1    Apr. 26, 2007

(30) Foreign Application Priority Data

Oct. 20, 2005  (JP)  ............................. 2005-305567
Oct. 12, 2006  (JP)  ............................. 2006-278621

(51) Int. Cl.
*H01S 5/00* (2006.01)
(52) U.S. Cl. .............................. 372/45.012; 372/45.01; 372/50.1; 372/50.11
(58) Field of Classification Search ........................ None
See application file for complete search history.

(56) References Cited

U.S. PATENT DOCUMENTS 5,719,891 A * 2/1998 Jewell ...................... 372/45.01
5,978,408 A * 11/1999 Thornton .................. 372/45.01
2005/0238076 A1* 10/2005 Kuwata et al. ............. 372/50.1
2007/0091965 A1 4/2007 Tanabe et al.

OTHER PUBLICATIONS

Kent D. Choquette et al "Advances in Selective Wet Oxidation of Al GaAs Alloys" *IEEE Journal of selected topics in quantum electronics*, vol. 3, No. 3, June 1997, pp. 916-926.
U.S. Appl. No. 11/554,973, filed Oct. 31, 2006, Hiraiwa, et al.
U.S. Appl. No. 11/551,101, filed Apr. 24, 2008, Iwai, et al.
U.S. Appl. No. 12/166,422, filed Jul. 2, 2008, Hiraiwa et al.
U.S. Appl. No. 11/551,101, filing date Oct. 19, 2006, Tanabe, et al.
U.S. Appl. No. 12/796,225, filing date Jun. 8, 2010, Hiraiwa, et al.

* cited by examiner

*Primary Examiner*—Minsun Harvey
*Assistant Examiner*—Sean Hagan
(74) *Attorney, Agent, or Firm*—Oblon, Spivak, McClelland, Maier & Neustadt, L.L.P.

(57) ABSTRACT

A vertical-cavity surface-emitting (VCSEL) device has a layer structure including a top DBR mirror, an active layer, a current confinement oxide layer, and a bottom DBR mirror, the layer structure being configured as a mesa post. The current confinement oxide layer has a central current injection area and a peripheral current blocking area oxidized from the sidewall of the mesa post. The mesa post has a substantially square cross-sectional shape, thereby allowing an oxidation heat treatment to configure a substantially circular current injection area in the current-confinement oxide layer.

10 Claims, 6 Drawing Sheets

VERTICAL-CAVITY SURFACE-EMITTING SEMICONDUCTOR LASER DEVICE

BACKGROUND OF THE INVENTION (a) Field of the Invention

The present invention relates to a vertical-cavity surface-emitting semiconductor laser (VCSEL) device and, more particularly, to a VCSEL device having a current-confinement oxide layer.

(b) Description of the Related Art

VCSEL devices are known in the art which emit laser in the direction perpendicular to the main surface of the substrate. The VCSEL devices have an advantage over the conventional semiconductor laser devices having a Fabry-Perot resonator in that a large number of VCSEL devices can be arranged in a two-dimensional array on a common substrate, and thus attract a larger attention these days especially in the field of data communication.

The VCSEL device includes a compound semiconductor substrate such as GaAs or InP substrate, a pair of distributed-Brag-reflector (DBR) mirrors, and a laser resonator sandwiched between the DBR mirrors and including an active layer for lasing at a specific wavelength The DBR mirrors each are configured by a plurality of pairs of semiconductor layers, each pair including a high-refractive-index layer and a low-refractive-index layer. The VCSEL device also includes a current-confinement oxide layer within or adjacent to one of the DBR mirrors, the current-confinement oxide layer including a central current injection area and a peripheral current blocking area which is selectively oxidized from the central current injection area. The current-confinement oxide layer has a current confinement function as well as an optical confinement function to reduce the threshold current required for lasing in the VCSEL device.

In a typical GaAs-group VCSEL device, the DBR mirror formed therein includes a plurality of pairs of $Al_xGa_{1-x}As/Al_yGa_{1-y}As$ layers, wherein x<y. This type of DBR mirror has the advantages of a higher thermal conductivity and a higher reflectance. In addition, GaAs-group VCSEL devices have the advantage of achieving a wider range of lasing frequency as wide as between 600 nm and 1600 nm by modifying the materials of the active layer.

With reference to FIG. 8, the configuration of a conventional VCSEL device will be described hereinafter. FIG. 8 schematically shows the sectional structure of the VCSEL device having a current-confinement oxide layer and lasing at a wavelength of around 850 nm.

The VCSEL device 10 includes an n-type GaAs (n-GaAs) substrate 12, and a layer structure formed thereon and including bottom DBR mirror 14, lower cladding layer 16, quantum-well (QW) active layer 18, upper cladding layer 20, and top DBR mirror 22. The bottom DBR mirror 14 includes 35 pairs of n-$Al_{0.2}Ga_{0.8}As$/n-$Al_{0.9}Ga_{0.1}As$ layers each having a thickness corresponding to $\lambda/(4n)$, where $\lambda$ and n are emission wavelength and refractive index, respectively. The top DBR mirror 22 includes 25 pairs of p-$Al_{0.2}Ga_{0.8}As$/p-$Al_{0.9}Ga_{0.1}As$ layers each having a thickness corresponding to $\lambda/(4n)$. The n-$Al_{0.2}Ga_{0.8}As$ layer and p-$Al_{0.2}Ga_{0.8}As$ layer configure the high-refractive-index layer, whereas the n-$Al_{0.9}Ga_{0.1}As$ layer and p-$Al_{0.9}Ga_{0.1}As$ layer configure the low-refractive-index layer.

In the top DBR mirror 22, one of the p-$Al_{0.9}Ga_{0.1}As$ layers near the active layer 18 is replaced by a current-confinement oxide layer 23 configured by an AlAs layer wherein the Al component of the AlAs layer in the peripheral area 25 is oxidized selectively from the central area 24 of the AlAs layer to configure a current blocking area 25 The current-confinement oxide layer 23 has a current confinement function as well as an optical confinement function, The top DBR mirror 22 is selectively etched using a photolithographic and etching technique to configure a cylindrical mesa post 51E having a diameter of 30 µm, for example, together with the current-confinement oxide layer 23 of the layer structure near the active layer 18.

For manufacturing the conventional VCSEL device 10 as described above, the layer structure configured as the mesa post 51E is subjected to an oxidizing heat treatment at a temperature of 400 degrees C. in a steam atmosphere. The oxidizing heat treatment oxidizes the peripheral annular area 25 of the current-confinement oxide layer 23 while allowing the central area 24 to be non-oxidized. The peripheral current blocking area 25 has a width of 10 µm, for example, and the central area of the current-confinement oxide layer 23 configures a current injection area 24

The mesa post 51E is embedded by a polyimide layer 26 on the periphery or sidewall of the mesa post 51E. The top of the mesa post 51E is attached with an annular p-side electrode 28 having a width of 5 to 10 µm. The bottom surface of the n-GaAs substrate 12 is polished to obtain a thickness of 200 µm for the n-GaAs substrate 12, and an n-side electrode 30 is formed thereon. In addition, a p-side electrode pad 32 in contact with the p-side electrode 28 is formed on the polyimide layer 26

In the conventional VCSEL device 10 as described above, the portion of the layer structure disposed radially outside the mesa post 51E is entirely removed However, another structure is also known in which an annular groove is formed in the layer structure to separate the mesa post 51E from the radially peripheral portion of the layer structure. In this structure, the annular groove is filled with a polyimide layer and the electrode pad is disposed on the peripheral portion of the layer structure.

There is a problem in the conventional VCSEL device 10 that oxidation of the periphery of the AlAs layer does not provide a satisfactory circular shape for the central current injection area 24 in the current-confinement oxide layer 23. The shape actually obtained is roughly a square instead of a circular shape. The current injection area 24 having a square shape or non-circle shape may cause an ununiform electric field in the vicinity of the apexes of the square shape, incurring an electrostatic discharge (ESD) breakdown to thereby degrade the product yield of the VCSEL devices.

A literature "IEEE Journal of selected topics in quantum electronics", vol. 3, No, 3, 916, 1997 describes a VCSEL device including a current-confinemnent oxide layer configured by $Al_{0.98}Ga_{0.02}As$ instead of AlAs. The $Al_{0.98}Ga_{0.02}As$ layer used as the current-confinement oxide layer 23 has a lower surface orientation dependency of the oxidation rate, thereby achieving a circular shape of the current injection area, which accurately reflects the cylindrical shape of the mesa post.

The accurate circular shape of the current injection area 24 reduces the possibility of the ESD breakdown. However, the $Al_{0.98}Ga_{0.02}As$ layer used for configuring the current-confinement oxide layer 23 incurs a higher restriction on the content ratio of the $Al_{0.98}Ga_{0.02}As$ layer for achieving a current injection area having an improved circular shape. In addition, the $Al_{0.98}Ga_{0.02}As$ layer has a lower oxidation rate compared to the AlAs layer, thereby consuming a larger time length for the oxidation heat treatment. The larger time length incurs oxidation of the periphery of the $Al_{0.9}Ga_{0.1}As$ layer in the DBR mirror, generating a volume reduction of the $Al_{0.9}Ga_{0.01}As$ layer due to the oxidation and degrading the reliability of the VCSEL device.

SUMMARY OF THE INVENTION

In view of the above problems in the conventional VCSEL device, it is an object of the present invention to provide a VCSEL device including a current-confinement oxide layer having a current injection area with an improved circular shape while using the conventional material for the current confinement layer, the VCSEL device being less susceptible to the volume reduction in the DBR mirror and thus an ESD breakdown of the current path.

The present invention provides, in a first aspect thereof, a vertical-cavity surface-emitting laser (VCSEL) device including: a substrate; and a layer structure formed on the substrate and including top and bottom DBR mirrors, an active layer sandwiched therebetween, and a current confinement oxide layer disposed within or in a vicinity of one of the top and bottom DBR mirrors and including therein a central current confinement area, wherein: at least a portion of the layer structure including the current confinement oxide layer is configured as a mesa post; at least a part of a sidewall of the mesa post in a vicinity of the current confinement oxide layer has a substantially plane symmetry with respect to each of first and second planes passing through a center of the mesa post and intersecting together at a right angle; and first portions of the sidewall of the mesa post disposed in a vicinity of first intersections between the sidewall and a third plane dividing the right angle formed between the first plane and the second plane protrudes outward in a radial direction from a radial position of second portions of the sidewall disposed in a vicinity of second intersections between the sidewall and each of the first and second planes The present invention provides, in a second aspect thereof a vertical-cavity surface-emitting laser (VCSEL) device including: a substrate; and a layer structure formed on the substrate and including top and bottom DBR mirrors, an active layer sandwiched therebetween, and a current confinement oxide layer disposed within or in a vicinity of one of the top and bottom DBR mirrors and including therein a central current confinement area, wherein: at least a portion of the layer structure including the current confinement oxide layer is configured as a mesa post; the mesa post includes therein a plurality of separate grooves disposed radially outside of the current injection area, the separate grooves having a substantially plane symmetry with respect to each of first and second planes passing through a center of the mesa post and intersecting together at a right angle; and the separate grooves are separated from one another in a vicinity of first intersections between the sidewall and a third plane dividing the right angle formed between the first plane and the second plane.

The present invention provides, in a third aspect thereof, a method for manufacturing a vertical-cavity surface-emitting laser (VCSEL) device having top and bottom DBR mirrors, an active layer sandwiched therebetween, and a current confinement oxide layer disposed within or in a vicinity of one of the top and bottom DBR mirrors and including therein a central current confinement area, the method including: forming a layer structure including a first layer on a substrate; etching the layer structure to form a mesa post having a sidewall, at least a portion of the sidewall in a vicinity of the current confinement oxide layer has a substantially plane symmetry with respect to each of first and second planes passing through a center of the mesa post and intersecting together at a right angle, first portions of the sidewall of the mesa post disposed in a vicinity of first intersections between the sidewall and a third plane dividing the right angle formed between the first plane and the second plane protruding outward in a radial direction from a radial position of second portions of the sidewall disposed in a vicinity of second intersections between the sidewall and each of the first and second planes; and heat treating the mesa post to oxidize an outer periphery of the first layer to configure the current confinement oxide layer.

In accordance with the VCSEL device of the present invention and the VCSEL device manufactured by the method of the present invention, the specific structure of the mesa post provides a substantially circular shape for the current injection area in the current-confinement oxide layer, thereby preventing the ESD breakdown and thus improving the reliability of the VCSEL device.

The above and other objects, features and advantages of the present invention will be more apparent from the following description, referring to the accompanying drawings.

PREFERRED EMBODIMENT OF THE INVENTION

Before describing embodiments of the present inventions the defective shape involved in the current injection area of the current-confinement oxide layer will be described for a better understanding of the present invention.

Figure 9A:
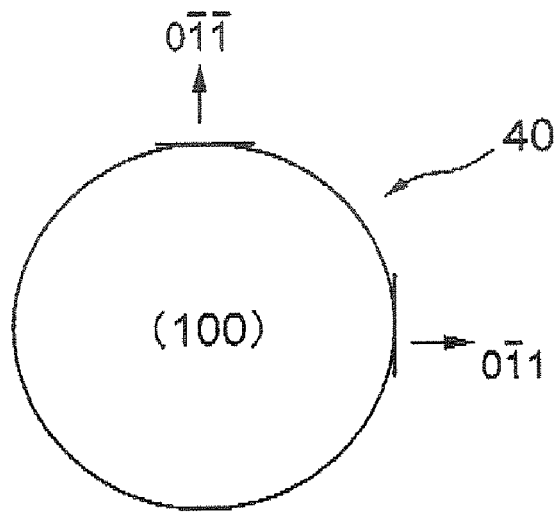
FIG. 9A is a top plan view of a wafer showing the crystal faces thereof.
Figure 9B:
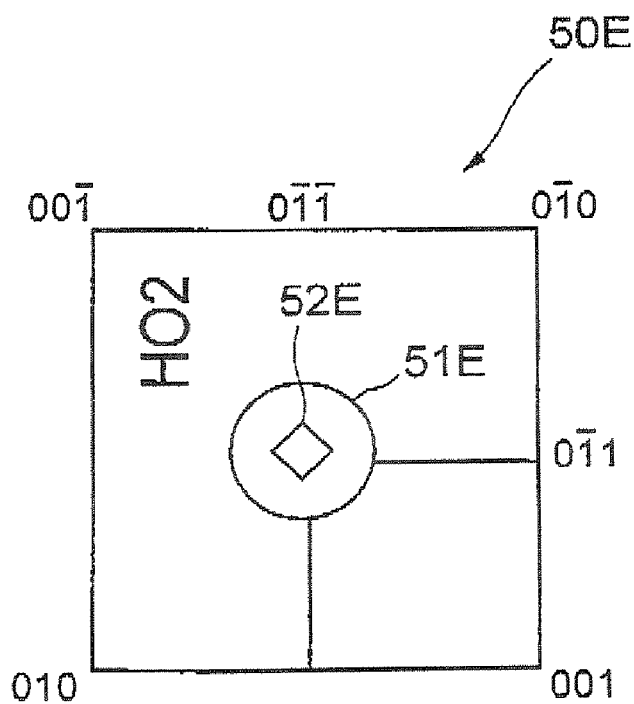
FIG. 9B is a top plan view of a VCSEL device showing the crystal faces thereof.

FIG. 9A shows a wafer 40 used for manufacturing VCSEL devices thereon, and FIG. 9B shows a VCSEL device 50E manufactured on the wafer 40 in a fabrication step thereof. In general, compound semiconductors, such as GaAs, AlAs and AlGaAs, used as a wafer material for manufacturing thereon VCSEL devices have a cubic-system zinc-blend structure. In general, a (100) crystal face is used as the main surface of a compound semiconductor wafer 40, on which layers of VCSELs are epitaxially grown, and the orientation flat is formed on a (01*1*) crystal face, as shown in FIG. 9A, wherein "1*" represents numeral "1" attached with a top bar and this expression applies to other portions of this text.

In manufacture of the VCSEL device 50E, the layers of the VCSEL device 50E are grown on the main surface, etched to configure a cylindrical mesa post 51E, and the AlAs layer in the mesa post 51E is thermally oxidized from the outer periphery or sidewall of the mesa post 51E to form the current injection area 52E. The resultant current injection area 52E has a roughly square shape such as shown in FIG. 9B however, differently from a desired circular shape of the current injection area, without reflecting the circular cross-sectional shape or cylindrical shape of the mesa post 51E.

The reason for the current injection area 52E having a roughly square shape is that four portions of the outer periphery of the mesa post 51E corresponding to (010), (01*0), (001) and (001*) crystal faces, which are equivalent to each other and collectively represented by <100> crystal faces, have a higher oxidation rate compared to the other portions corresponding to the other crystal faces. The ratio of the oxidation rate in the direction to the <100> crystal faces from the center is roughly 1.23 times the oxidation rate in the direction to the other crystal faces. The roughly square current injection area 52E incurs a current concentration or conversion in the vicinity of the apexes of the square current path, thereby sometimes causing an electrostatic (ESD) breakdown. The present invention is devised to solve this defective shape of the current injection area.

Figure 1A:
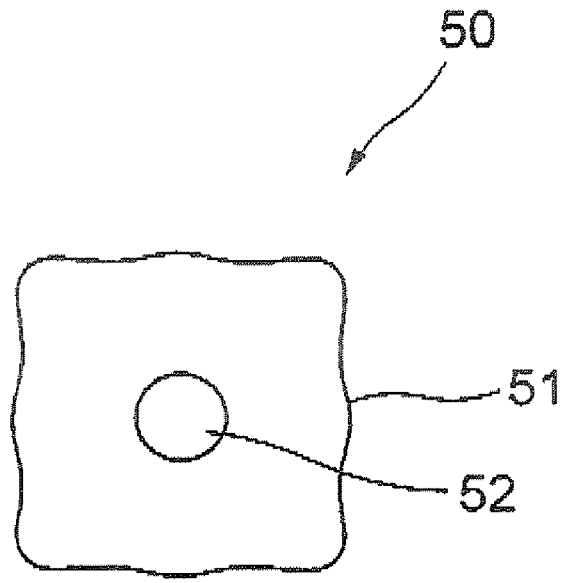
FIG. 1A is a top plan view of a mesa post of a VCSEL device according to a first embodiment of the present invention.

Now, the present invention is more specifically described with reference to accompanying drawings, wherein similar constituent elements are designated by similar or related reference numerals throughout the drawings. FIG. 1A shows a VCSEL device according to a first embodiment of the present invention.

Figure 8:
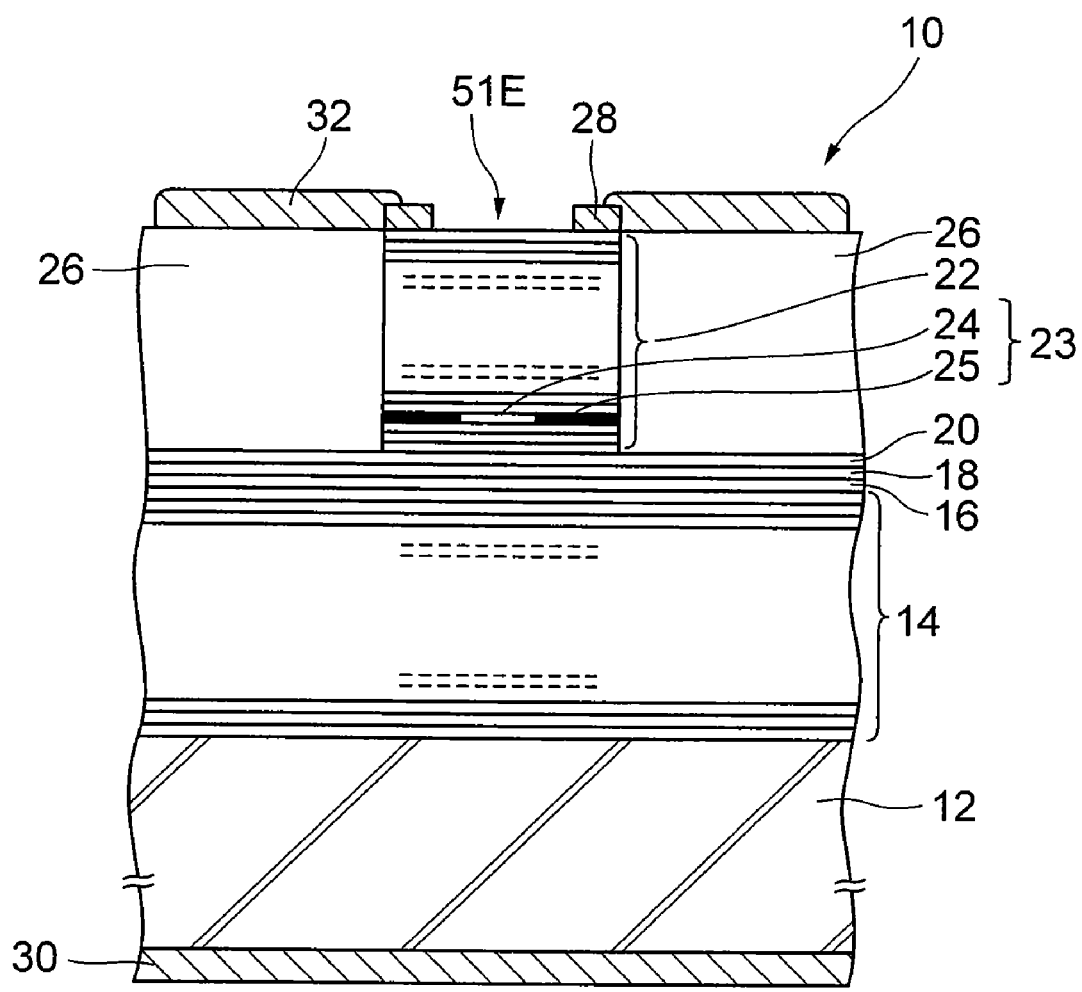
FIG. 8 is a sectional view of a typical VCSEL device.

The VCSEL device, generally designated by numeral 50, according to the present embodiment is similar to the conventional VCSEL device 10 shown in FIG. 8 except for the planar shape of the mesa post 51, and for the shape of the current injection area 52 accordingly. More specifically, the VCSEL device 50 of the present embodiment has a layer structure similar to that of the VCSEL device of FIG. 8, and thus detailed description of the layer structure thereof will be omitted here for avoiding a duplication.

The VCSEL device 50 of the present embodiment includes the mesa post 51 having a cross-sectional structure wherein five circular arcs are combined together, differently from the rotational symmetry of the conventional mesa post 51E. The specific cross-sectional structure of the mesa post 51 in the present embodiment provides a current-confinement oxide film including a current injection area 52 having a substantially rotational symmetry, i.e., substantially idealized circular shape.

The VCSSEL device 50 has a layer structure formed on a main surface of the wafer expressed by (100) crystal face, and the mesa post 51 is formed by etching the layer structure. The mesa post 51 has four protrusions on the portions of a generally cylindrical outer periphery thereof, the portions each having a crystal face expressed by <100>, i.e., (010), (01*0), (001) or (001*) crystal face. The protrusions have a circular arc cross section having a smaller diameter. The other portions of the mesa post 51 in combination configure a circular arc cross section having a larger diameter.

Figure 1B:
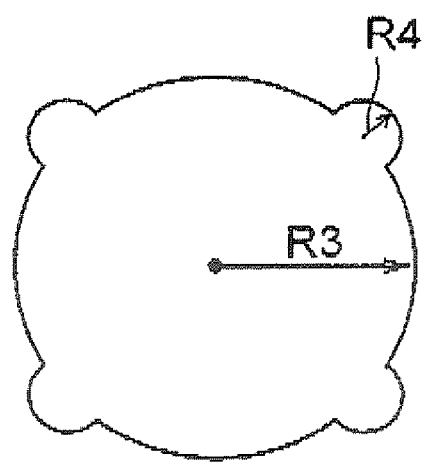
FIG. 1B is a top plan view of an etching mask used for forming the mesa post of FIG. 1A.

FIG. 1B shows a pattern of an etching mask for use in forming the mesa post 51 shown in FIG. 1A. As shown in this figure, the mask pattern includes a large circular arc, and four small circular arcs combined to the large circular arc. The four small circular arcs each have a center on the large circular arc, and configure an apex of the square of the mesa s post 51. The radius R3 of the large circular arc and the radius R4 of the small circular arcs are determined such that the radius R1 of the inscribing circle of the mesa post 51 and the radius R2 of the circumscribing circle of the mesa post 51 have therebetween a relationship 1.15<R2/R1<1.45. More specifically, the outermost periphery of the four protrusions protrude from the other portions of the mesa post 51 in the radially outward direction by an amount of 0.15·R1 to 0.45·R1. Thus, the radius R4 of the small circular arcs and the radius R3 of the large circular arc are determined so that R3 is in the range between 0.15·R4 and 0.45·R4 inclusive of both.

The configuration of the mesa post 51 employed in the present embodiment allows the AlAs layer to have a substantially circular current injection area 52, the AlAs layer having a higher oxidation rate in the direction to (010), (01*0), (001) and (001*) crystal faces from the center and vice versa. For example, if a current injection area having a diameter of 100 μm² is desired, the thermal oxidation process should be conducted at a temperature of 410 degrees C. for a time length of 25 minutes. It is preferable that the radius R1 of the inscribing circle of the mesa post 51 and the radius r1 of the inscribing circle of the current injection area 52 have a relationship 2.5<R1/r1<4.0 therebetween. The AlAs layer may be replaced by an $Al_xGa_{1-x}As$ layer where $0.98 \leq x \leq 1$.

It is known that a conventional VCSEL device has an offset substrate wherein the main surface of the offset substrate is about 20 degrees deviated from the <100> crystal face. The offset substrate also has a crystal face dependency of the oxidation rate similarly to the above case. Thus, the present invention can be also applied to such an offset substrate to obtain a current injection area having a substantially circular shape. The current injection area 52 may be referred to as an oxide aperture. It is to be noted that the offset angle or offset crystal orientation of the substrate may affect the oxidation rate depending on the degree of inclination, and thus the shape of the mesa post 51 should be sometimes adjusted for obtaining a desired circular shape of the current injection area 52. It is preferable that the inclined angle of the offset substrate be within 20 degrees, and more preferably within 10 degrees.

Figure 2:
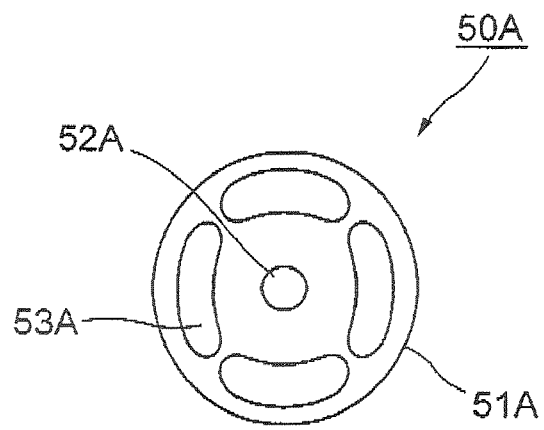
FIG. 2 is a top plan view of a mesa post of a VCSEL device according to a second embodiment of the present invention.

FIG. 2 shows the planar shape of the mesa post and current injection area of a VCSEL device according to a second embodiment of the present invention. The VCSEL device, generally designated by reference sign 50A, according to the present embodiment includes four grooves 53A within the mesa post 51A in the vicinity of the cylindrical sidewall of the mesa post 51A. The four grooves 53A are arranged such that an annular grooves is separated in the vicinity of portions of the outer periphery of the mesa post 51A located in the direction to the (010), (01*0), (001) and (001*) crystal faces as viewed from the center of the mesa post 51A, and thus referred to as separate grooves hereinafter. The separate grooves 53A are filled with a polyimide film In the configuration of the present embodiment, since the AlAs layer has an oxidation rate anisotropy in which the AlAs layer has a higher oxidation rate in the directions to the (010), (01*0), (001) and (001*) crystal faces, the AlAs layer has a longer distance in the oxidation path corresponding to the locations, whereby the resultant current injection area 52A formed inside the separate groves 53A has a substantially circular shape, as shown in FIG. 2. The VCSEL device 50A has a layer structure similar to the layer structure shown in FIG. 8.

Figure 3:
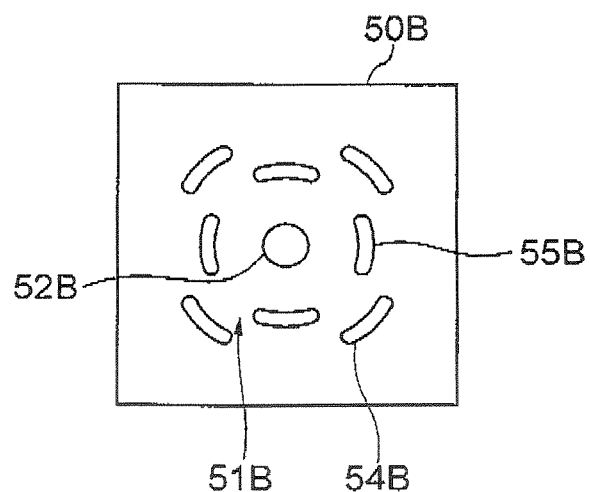
FIG. 3 is a top plan view of a VCSEL device according to a third embodiment of the present invention.

FIG. 3 shows a VCSEL device according to a third embodiment of the present invention. The VCSEL device, generally designated by reference sign 50B, has eight separate grooves 541B, 55B outside the mesa post 51B, wherein the eight separate grooves 54B, 55B in combination correspond to the annular groove formed in the conventional VCSEL device. More specifically the inner periphery of the separate grooves 54B, 55B configure the sidewall of the mesa post 51B although the layer structure of the mesa post 51B is coupled to the layer structure of the peripheral area of the VCSEL device 50B via the locations at which the separate grooves 54B, 55B are separated from one another. Four separate grooves 54B located in the directions to the (010), (01*0), (001) and (001*) crystal faces as viewed from the center of the mesa post 51B are disposed radially outside of the location of the other four separate grooves 55B The inner periphery of the separate grooves 54B, 55B substantially configures the sidewall of the mesa post 51B.

Again in the third embodiment, since the AlAs layer has an oxidation rate anisotropy in which the AlAs layer has a higher oxidation rate in the directions to the (010), (01*0), (001) and (001*) crystal faces, the resultant current injection area 52B formed within the mesa post 51B has a substantially circular shape. The mesa post 51B in the VCSEL device 50B of the present embodiment is different from the conventional mesa post, which is separated by the annular groove from the peripheral area of the VCSEL device, in that the layer structure of the mesa post 51B is partially coupled to the layer structure in the peripheral area of the VCSEL device 50B of the present embodiment The mesa post 51B of the present embodiment has a function similar to the function of the conventional mesa post however, and yet has a larger mechanical strength due to the coupled layer structure.

In a modification of the third embodiment, separate grooves similar to the separate grooves 53A arranged in a annular shape in FIG. 2 may be disposed outside of the mesa post 51B in the vicinity of the mesa post.

Figure 4:
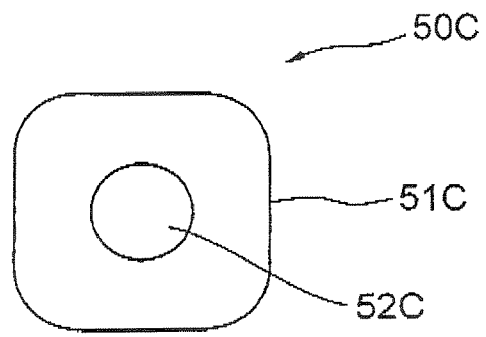
FIG. 4 is a top plan view of a mesa post of a VCSEL device according to a fourth embodiment of the present invention.

FIG. 4 shows the mesa post and current injection area of a VCSEL device according to a fourth embodiment of the present invention. The VCSEL device, generally designated by reference sign 50C, has a mesa post 51C having a substantially square planar shape having apexes on the locations corresponding to the (010), (01*0), (001) and (001*) crystal faces. The resultant current injection area 52C has a substantially circular shape accordingly.

The mesa post of the present invention may have a variety of planar shapes For example, the circular arcs formed on the apexes of the substantially square cross section of the mesa post in the first embodiment may be replaced by other suitable shape.

In any cases of the cross sectional shape of the mesa post employed in the present invention, the mesa post should preferably have a configuration wherein the circumscribing circle of the mesa post has a radius between 1.15 times and 1.45 times the radius of the inscribing circle of the mesa post. The mesa post may have protrusions on the portions of the outer periphery of the mesa post disposed in the directions to the (010), (01*0), (001) and (001*) crystal faces from the center of the mesa post, or may be coupled to the outer periphery of the VCSEL device via those portions, as described with reference to the third electromagnetic and modification thereof. In either case, the radius (r1) of the inscribing circle of the current injection area and the radius (r2) of the circumscribing circle of the current injection area preferably have therebetween a relationship $r1 > \sqrt{2} \cdot r2/2$. The current injection area preferably has an area of 120 μm² or smaller in view of the laser characteristic.

It is to be noted that the mesa post generally has a larger cross-sectional area in the bottom portion thereof than in the top portion, because the mesa post is configured by etching the layer structure by using a mask pattern as an etching mask. Thus, the conventional mesa post 51E shown in FIG. 8 may have a larger bottom area, although the larger bottom area is not specifically depicted therein. This structure is also applicable to the configuration of the mesa post in the VCSEL device of the present invention.

It is sufficient for the mesa post in the VCSEL device of the present invention to have the configuration wherein at least a portion of the mesa post adjacent to the current-confinement oxide layer have the specific structure because the specific structure allows the current injection area to have a substantially circular shape In this view point, it is sufficient that the radii R1 and R2 of the inscribing and circumscribing circles, respectively, of the mesa post have the specific relationship as recited before at least in the portion of the current-confinement oxide layer and the vicinity thereof.

The configuration of the mesa post in the VCSEL device of the above embodiments can be obtained basically by forming a layer structure including an AlAs layer on a semiconductor substrate, and subsequently etching the layer structure by using a mask pattern having roughly the desired planar shape of the mesa post as an etching mask. The current-confinement oxide layer is formed by oxidizing the peripheral area of the AlAs layer in a steam atmosphere from the periphery of the mesa post. The resultant AlAs layer has the peripheral current blocking area and the central current injection area The time length for the optimum oxidation is obtained by measuring the time length for achieving a substantially circular current injection area while experimentally oxidizing the AlAs layer.

Figure 5:
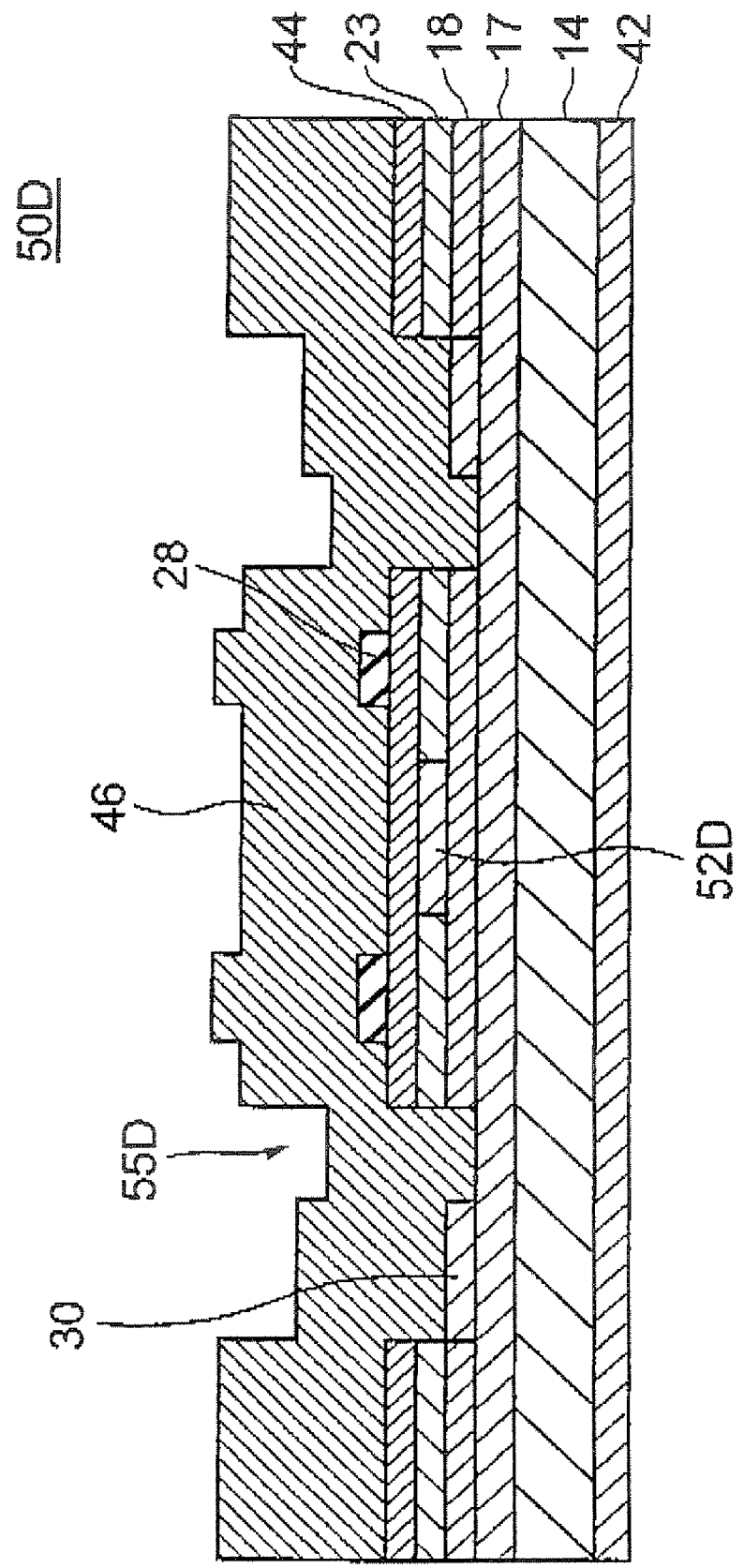
FIG. 5 is a sectional view of a mesa post of a VCSEL device according to a fifth embodiment of the present invention
Figure 6:
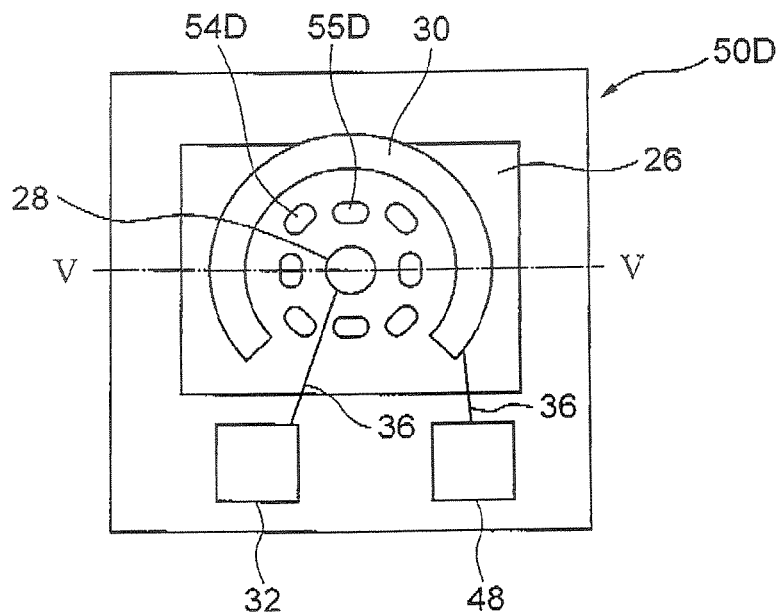
FIG. 6 is a top plan view of the VCSFL device of FIG. 5.

FIGS. 5 and 6 show a sectional view and a top plan view, respectively, of a VCSEL device according to a fifth embodiment of the present invention. FIG. 5 is a sectional view taken along line V-V in FIG. 62. The VCSEL device, generally designated by reference sign 50D, is formed on an n-GaAs substrate 42. On the n-GaAs substrate 42, a layer structure is deposited which consecutively includes a bottom semiconductor DBR mirror 14, an n-contact layer 17, an active layer 18, a current-confinement oxide layer 23, and a p-contact layer 44 on which an annular p-side electrode 28 is formed.

After deposition of the layer structure up to the p-contact layer 44, separate grooves 54D, 55D similar to the separate grooves in the third embodiment are formed in a portion of the layer structure including the p-contact layer 44, current-confinement oxide layer 23 and active layer 18 The separate grooves include eight grooves 54D, 55D wherein four grooves 54D are disposed in the directions to the <100> crystal faces from the center of the mesa post, and other four grooves 55D each are disposed between each adjacent two of the grooves 54D and are disposed radially inner side of the location of groves 54D.

As in the case of the precedent embodiments, the periphery of the AlAs layer in the layer structure is oxidized through the grooves 54D, 55D in a steam atmosphere, to configure therein the central current injection area 52D. An annular n-side electrode 30 is formed on top of the n-contact layer 17 in the area radially outer side of the separate grooves 54D, 55D. Interconnect lines connecting together the p-side electrode pad 28 and p-side electrode 32 and connecting together the n-side electrode 30 and n-side electrode pad 48 are also formed concurrently. A dielectric top DBR mirror 46 including pairs of dielectric layers having different refractive indexes is then deposited on the entire surface The p-side electrode pad 32 and n-side electrode pad 48 are then formed on the dielectric top DBR mirror 46.

Samples of the first embodiment and comparative examples were manufactured and subjected to measurements for the ESD resistance performance of the current injection area therein. The comparative examples each included a mesa post having a circular cross-sectional shape and a substantially square current injection area, and had emission wavelengths of 850 nm and 1300 nm. The samples of the first embodiment included the mesa post 51 and current injection area 52 shown in FIG. 1A, and had an emission wavelength of 850 nm. The measurements of the ESD resistance performance were performed based on the standard of human body model (HBM) of MIL-STD-883.

Figure 7:
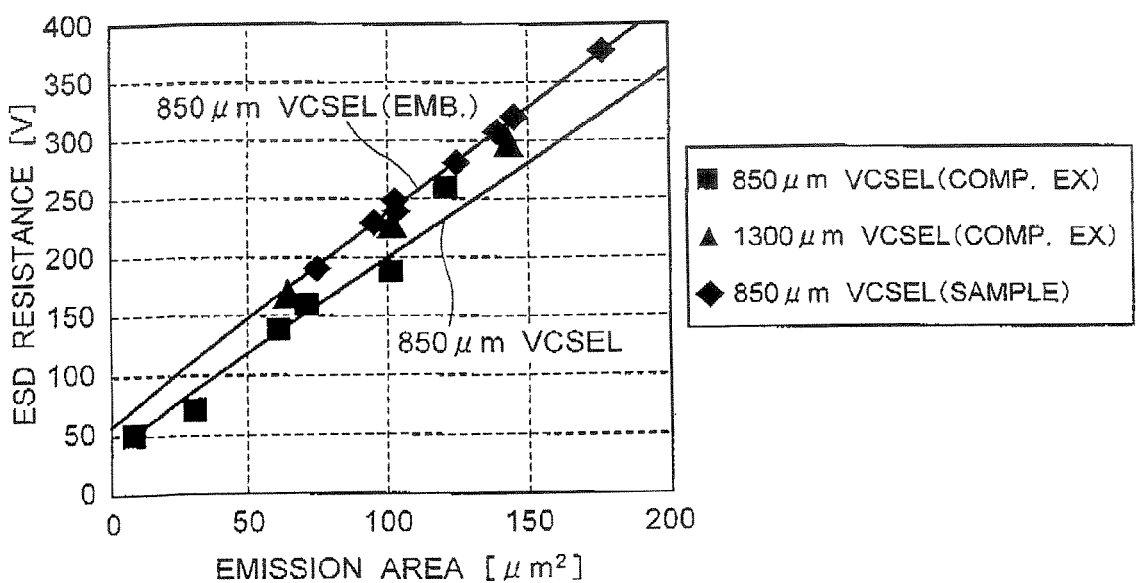
FIG. 7 is a graph showing a resistance performance against an ESD breakdown in the VCSEL devices of the present invention and the conventional technique.

In each of the samples and comparative examples, the current-confinement oxide layer is obtained from an AlAs layer. The radius R1 of the inscribing circle of the mesa post in the samples was 36 μm, 38 μm, 40 μm and 42 μm. The radius R2 of the circumscribing circle of the mesa post in the samples was 10 μm and 12 μm. FIG. 7 shows the results of the measurements of the ESD resistance performance for the samples and comparative examples. In FIG. 7, square dots, triangle dots and rhombic dots represent the measured ESD resistance (volts) of 850 nm VCSEL devices of the comparative example, 1300 nm VCSEL devices of the comparative example, and 850 nm VCSEL devices of the sample, respectively.

As understood from FIG. 7, the samples of the first embodiment of the present invention had an ESD resistance performance higher than that of the comparative examples. The samples having an emission wavelength of 850 μm had an ESD resistance performance equivalent to the ESD resistance performance of the comparative examples having an emission wavelength of 1300 μm. It is known in the art that a conventional VCSEL device having a short emission wavelength and thus having smaller dimensions has a lower ESD resistance performance and thus has a reduced ESD resistance performance compared to another VCSEL device having a longer emission wavelength It is thus concluded that the circular current injection area formed in the VCSEL device of the present invention provides a higher ESD resistance performance for the VCSEL device.

Since the above embodiments are described only for examples, the present invention is not limited to the above embodiments and various modifications or alterations can be easily made therefrom by those skilled in the art without departing from the scope of the present invention.

For example, the emission wavelength is not limited to 850 nm range and may be other wavelength ranges, such as 650 nm, 980 nm, 1300 nm and 1500 nm ranges. In this case, the semiconductor materials of the layer structure for the active layer and DBR mirrors may have modified concentrations.

The n-type GaAs substrate may be replaced by a p-type substrate, wherein the conductivity type of the semiconductor layers are reversed top side down from the semiconductor layers of the above embodiment. In this case, it is preferable that the current-confinement oxide layer be formed within or adjacent to the semiconductor or dielectric top DBR mirror. The current-confinement oxide layer may be made of a material including therein a III-group element and a V-group element, such as AlN and GaN instead of AlAs.

The present invention can be suitably applied to a VCSEL device for use in a light source of a data communication system using an optical fiber.

What is claimed is:

1. A vertical-cavity surface-emitting laser (VCSEL) device comprising:
   a substrate; and
   a layer structure formed on said substrate and including top and bottom DBR mirrors, an active layer sandwiched therebetween, and a current confinement oxide layer disposed within or in a vicinity of one of said top and bottom DBR mirrors and including therein a central current confinement area, wherein:
   at least a portion of said layer structure including said current confinement oxide layer is configured as a mesa post with a generally cylindrical outer periphery;
   at least a part of a sidewall of said mesa post in a vicinity of said current confinement oxide layer has plural protrusions on portions of said generally cylindrical outer periphery, before the mesa post is subjected to an oxidizing heat treatment, wherein each of said plural protrusions protrudes in a direction to a crystal surface having a higher oxidation rate.

2. The VCSEL device according to claim 1, wherein said mesa post has a cubic-system crystal structure, and said plural protrusions are four protrusions formed in the direction to (010) crystal face, (01*0) crystal face, (001) crystal face and (001*) crystal face, respectively.

3. The VCSEL device according to claim 1, wherein a radius (R1) of an inscribing circle of said mesa post and a radius (R2) of a circumscribing circle of said mesa post have a relationship 1.15<R2/R1<1.45 therebetween.

4. The VCSEL device according to claim 1, wherein said top DBR mirror is a semiconductor DBR mirror, and said mesa post includes said semiconductor DBR mirror.

5. The VCSEL device according to claim 1, wherein said top DBR mirror is a dielectric DBR mirror, and covers at least a top portion of said layer structure including said mesa post.

6. The VCSEL device according to claim 1, wherein said mesa post is substantially square in a cross-sectional shape.

7. The VCSEL device according to claim 1, wherein said sidewall of said mesa post includes a first cylindrical portion having a center coinciding with a center of said mesa post, and four second cylindrical portions forming the plural protrusion portions and each having a center on said first cylindrical portion.

8. The VCSEL device according to claim 1, wherein a radius (R1) of an inscribing circle of a current injection area and a radius (R2) of a circumscribing circle of said current injection area have therebetween a relationship:

$$r2 \geq r1 > \sqrt{2}r2/2.$$

9. The VCSEL device according to claim 1, wherein a current injection area includes $Al_xGa_{l-x}As$ having a zinc-blend structure.

10. The VCSEL device according to claim 9, wherein said x satisfies the following $$0.98 \leq x \leq 1.0.$$

* * * * *